United States Patent
Taniguchi

(10) Patent No.: US 9,306,528 B2
(45) Date of Patent: Apr. 5, 2016

(54) COMPOSITE LC RESONATOR AND BAND PASS FILTER

(71) Applicant: Murata Manufacturing Co., Ltd., Nagaokakyo-shi, Kyoto-fu (JP)

(72) Inventor: Tetsuo Taniguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/754,820

(22) Filed: Jun. 30, 2015

(65) Prior Publication Data

US 2015/0303890 A1 Oct. 22, 2015

Related U.S. Application Data

(63) Continuation of application No. PCT/JP2014/069143, filed on Jul. 18, 2014.

(30) Foreign Application Priority Data

Oct. 24, 2013 (JP) .................................. 2013-220989

(51) Int. Cl.
*H03H 7/01* (2006.01)
*H03H 7/075* (2006.01)
*H03H 1/00* (2006.01)

(52) U.S. Cl.
CPC ............. *H03H 7/0115* (2013.01); *H03H 7/075* (2013.01); *H03H 7/1791* (2013.01); *H03H 2001/0085* (2013.01)

(58) Field of Classification Search
CPC ................... H03H 2001/0085; H03H 7/0115; H03H 7/0161; H03H 7/12; H03H 7/1791

USPC .................................................. 333/175, 185
See application file for complete search history.

(56) References Cited

U.S. PATENT DOCUMENTS

2007/0241839 A1 10/2007 Taniguchi
2012/0119852 A1* 5/2012 Sasaki et al. .................. 333/204

FOREIGN PATENT DOCUMENTS

EP 2 009 787 A1 12/2008
JP 10-190305 A 7/1998
(Continued)

OTHER PUBLICATIONS

Official Communication issued in International Patent Application No. PCT/JP2014/069143, mailed on Oct. 14, 2014.

*Primary Examiner* — Benny Lee
*Assistant Examiner* — Rakesh Patel
(74) *Attorney, Agent, or Firm* — Keating & Bennett, LLP

(57) ABSTRACT

A composite LC resonator includes a ground electrode adjacent to a first principal surface of a multilayer body, a first capacitor electrode farther inward than the ground electrode and defining a first capacitor together with the ground electrode, a first electrode of a second capacitor, a second electrode of the second capacitor defining a second capacitor together with the first electrode of the second capacitor, a first via-electrode defining a first inductor, a first end of the first via-electrode electrically connected to the first capacitor electrode and a second end of the first via-electrode electrically connected to the first electrode of the second capacitor, and a second via-electrode defining a second inductor, a first end of the second via-electrode electrically connected to the second electrode of the second capacitor and a second end of the second via-electrode being electrically connected to the ground electrode.

16 Claims, 9 Drawing Sheets

(56) References Cited

FOREIGN PATENT DOCUMENTS

| | | |
|---|---|---|
| JP | 3501327 B2 | 3/2004 |
| JP | 2011-244504 A | 12/2011 |
| JP | 2013-150100 A | 8/2013 |
| WO | 2007/119356 A1 | 10/2007 |

\* cited by examiner

COMPOSITE LC RESONATOR AND BAND PASS FILTER

BACKGROUND OF THE INVENTION

1. Field of the Invention

The present invention relates to a composite LC resonator including a plurality of inductors and a plurality of capacitors and to a band pass filter including a plurality of composite LC resonators.

2. Description of the Related Art

A multilayer band pass filter is disclosed in Japanese Unexamined Patent Application Publication No. 2011-244504 in which capacitor electrodes and loop-shaped inductors formed by combinations of line electrodes and via-electrodes are disposed within a multilayer body including a plurality of insulating layers. In the multilayer band pass filter disclosed in Japanese Unexamined Patent Application Publication No. 2011-244504, a plurality of resonators defined by parallel LC resonance circuits are sequentially coupled with each other.

An LC resonator component is disclosed in Japanese Patent No. 3501327 in which capacitor electrodes disposed parallel with insulating layers and an inductor conductor, one end of which is perpendicularly connected to one of the capacitor electrodes, are disposed within a multilayer body including a plurality of insulating layers.

In the configuration disclosed in Japanese Unexamined Patent Application Publication No. 2011-244504, it is difficult to provide an attenuation pole, as desired, outside of a passband. If the number of reactance elements is increased to provide an attenuation pole, the size of the multilayer band pass filter is increased. In the multilayer band pass filter disclosed in Japanese Unexamined Patent Application Publication No. 2011-244504, although a ground electrode is disposed along the bottom surface of the multilayer body, the multilayer band pass filter, as a whole, does not have a shielding function. If, in the configuration disclosed in Japanese Unexamined Patent Application Publication No. 2011-244504, a ground electrode is formed along the top surface of the multilayer body, an unwanted capacitance is generated between a line electrode and the ground electrode, which may decrease the characteristics of the band pass filter.

In contrast, in the configuration disclosed in Japanese Patent No. 3501327, ground electrodes are disposed along the top and bottom principal surfaces of the multilayer body, and thus, the above-described shielding function can be provided. However, in accordance with a lower height of the multilayer body, the inductance exhibited by a via-electrode is reduced. This makes it impossible to form a resonator having a desired resonant frequency or a filter having desired band pass characteristics. Thus, it is difficult to decrease the size of the LC resonator component.

SUMMARY OF THE INVENTION

Accordingly, preferred embodiments of the present invention provide a composite LC resonator including a shielding function and inductors having a high Q factor, which are reduced in size and height and which makes it possible to provide an attenuation pole outside of a passband, and also provide a band pass filter including the composite LC resonators.

Characteristics of a composite LC resonator, as a circuit, according to a preferred embodiment of the present invention are as follows. The composite LC resonator is disposed in a multilayer body which includes a plurality of insulating layers stacked on each other and which includes plate electrodes arranged along principal surfaces and via-electrodes passing through insulating layers in a direction of the insulating layers. The composite LC resonator includes a plurality of capacitors and a plurality of inductors which are defined by the plate electrodes and the via-electrodes or one of the plate electrodes and the via-electrodes. The composite LC resonator includes a ground electrode disposed adjacent to a first principal surface (close to the first principal surface) of the multilayer body; a first capacitor electrode that is disposed farther inward than the ground electrode and that defines a first capacitor together with the ground electrode; a first electrode of a second capacitor; a second electrode of the second capacitor that defines a second capacitor together with the first electrode of the second capacitor; a first inductor, a first end of the first inductor being electrically connected to the first capacitor electrode and a second end of the first inductor being electrically connected to the first electrode of the second capacitor; and a second inductor, a first end of the second inductor being electrically connected to the second electrode of the second capacitor and a second end of the second inductor being electrically connected to the ground electrode.

Structural characteristics of a band pass filter according to a preferred embodiment of the present invention are as follows. The band pass filter includes a plurality of composite LC resonators provided in a single multilayer body, each of the composite LC resonators defining the above-described composite LC resonator; and a coupling electrode that couples adjacent composite LC resonators of the plurality of composite LC resonators. With this configuration, it is possible to provide a band pass filter in which attenuation poles are generated at both sides of a passband by the coupling of the plurality of composite LC resonators.

The coupling electrode may include a coupling capacitor electrode electrically connected to the via-electrode defining the first inductor and to the first capacitor electrode. With this configuration, by capacitively coupling the resonators, it is possible to implement a filter having excellent attenuation characteristics at a low frequency side.

The coupling electrode may include a coupling inductor electrode and a coupling capacitor electrode connected in parallel with each other. With this configuration, the resonators are coupled with each other by a parallel LC resonator, and thus, it is possible to implement a filter having excellent attenuation characteristics at a high frequency side, as well as at a low frequency side.

A portion of the coupling inductor electrode may preferably be defined by the via-electrode. With this configuration, the Q factor of the coupling inductor is improved, thus reducing the insertion loss of the filter.

The via-electrode defining the coupling inductor electrode may preferably be disposed between a via-electrode defining the first inductor and a via-electrode defining the second inductor. With this configuration, it is possible to adjust the amount of coupling between the inductors of the first-stage composite LC resonator and the coupling inductor and between the inductors of the second-stage composite LC resonator and the coupling inductor. That is, it is possible to set filter characteristics in accordance with the amount of coupling between the two composite LC resonators via the coupling inductor.

According to various preferred embodiments of the present invention, the following advantages are obtained.

The resonance circuit of the composite LC resonator is shielded by the ground electrode disposed adjacent to the first principal surface of the multilayer body.

The first and second inductors are electrically connected in series with each other, and also, they are not longitudinally disposed, but are disposed side by side within the multilayer body, thus reducing the size and the height of the multilayer body.

By disposing the second capacitor between the first and second inductors, a series LC resonance circuit is provided within a parallel LC resonance circuit, thus making it possible to provide an attenuation pole.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
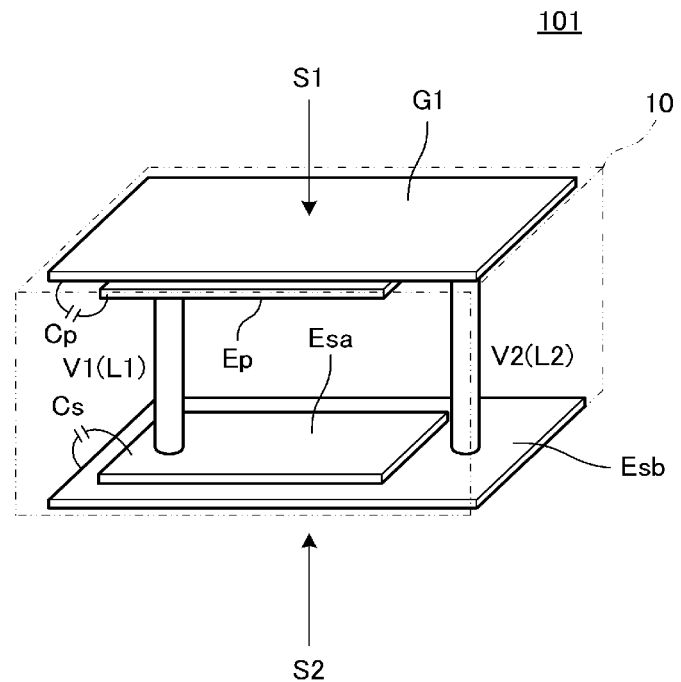
FIG. 1 is a perspective view of a multilayer body including multiple insulating layers stacked on each other in which a composite LC resonator 101 according to a first preferred embodiment of the present invention is provided.

Preferred embodiments of the present invention will be described below with reference to the drawings through illustration of some specific examples. In the drawings, the same elements or portions are designated by like reference numerals or symbols. The following preferred embodiments are only examples, and the configurations described in the different preferred embodiments can be partially swapped or combined.

First Preferred Embodiment

FIG. 1 is a perspective view illustrating the configuration of the major portion of a composite LC resonator 101 according to a first preferred embodiment of the present invention. In this example, the configuration shown in FIG. 1 is a perspective view of a multilayer body including multiple insulating layers stacked on each other in which the composite LC resonator 101 is provided. However, the multiple insulating layers are not shown, and the outer configuration of a multilayer body 10 is indicated by the long dashed double-dotted lines. The composite LC resonator 101 includes plate electrodes arranged along the principal surfaces of the insulating layers and via-electrodes passing through the insulating layers in their direction.

A ground electrode G1 defined by a plate electrode is disposed adjacent to a first principal surface S1 (close to the first principal surface) of the multilayer body 10. A first capacitor electrode Ep defined by a plate electrode is disposed farther inward than the ground electrode G1. The first capacitor electrode Ep and the ground electrode G1 define a first capacitor Cp.

A second electrode Esb, which is defined by a plate electrode, of a second capacitor, is disposed adjacent to a second principal surface S2 (close to the second principal surface) of the multilayer body 10. A first electrode Esa of the second capacitor is disposed farther inward than the second electrode Esb of the second capacitor. The first and second electrodes Esa and Esb of the second capacitor define a second capacitor Cs.

A via-electrode V1 defining a first inductor L1 is disposed between the first capacitor electrode Ep and the first electrode Esa of the second capacitor. A first end of the via-electrode V1 is electrically connected to the first capacitor electrode Ep, and a second end thereof is electrically connected to the first electrode Esa of the second capacitor.

A via-electrode V2 defining a second inductor L2 is disposed between the second electrode Esb of the second capacitor and the ground electrode G1. A first end of the via-electrode V2 is electrically connected to the second electrode Esb of the second capacitor, and a second end thereof is electrically connected to the ground electrode G1.

In this manner, the ground electrode G1 is adjacent to the first principal surface of the multilayer body, while the second electrode Esb of the second capacitor is adjacent to the second principal surface, and the two inductors L1 and L2 and the two capacitors Cp and Cs are disposed between the ground electrode G1 and the second electrode Esb of the second capacitor. With this configuration, the resonance circuit is shielded by the ground electrode G1 and the second electrode Esb of the second capacitor.

The ground electrode G1, the second electrode Esb of the second capacitor, the first capacitor electrode Ep, and the first electrode Esa of the second capacitor are disposed perpendicularly to the via-electrodes V1 and V2. Thus, the ground electrode G1, the second electrode Esb of the second capacitor, the first capacitor electrode Ep, and the first electrode Esa of the second capacitor do not interfere with magnetic fields generated by the via-electrodes V1 and V2, and thus, it is unlikely that Eddy currents will be induced. Accordingly, Eddy current loss caused by the ground electrode G1, the second electrode Esb of the second capacitor, the first capacitor electrode Ep, and the first electrode Esa of the second capacitor is small. It is thus possible to provide the inductors L1 and L2 having a high Q factor.

The inductors L1 and L2 have inductance values through the use of via-electrodes. Accordingly, compared with inductors defined by plate electrodes (linear electrodes), which are used for capacitor electrodes, the direct current resistance (DCR) per unit inductance of the inductors L1 and L2 is small, and thus, the Q factor is high.

The first inductor L1 and the second inductor L2 are linked with each other via the second capacitor Cs. Accordingly, the inductors L1 and L2 are electrically connected in series with each other. It is thus possible to provide inductors (L1+L2) having a predetermined inductance within a low-height multilayer body.

Figure 2:
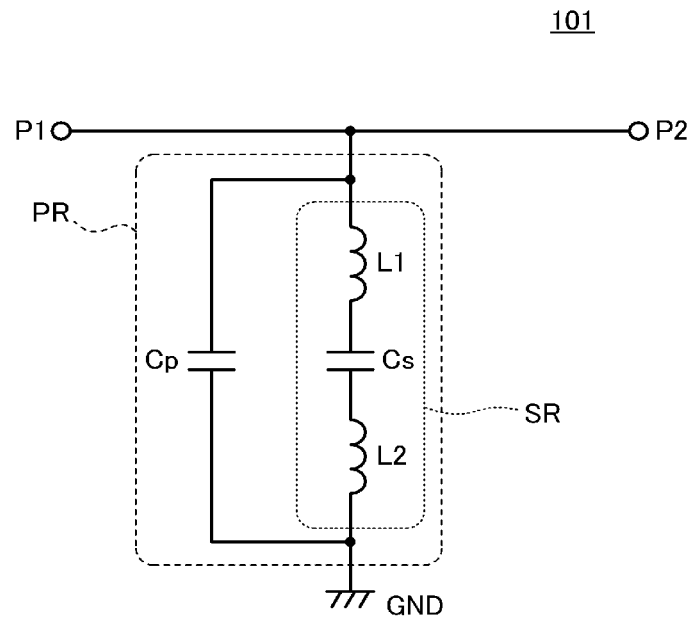
FIG. 2 is a circuit diagram of the composite LC resonator 101.

FIG. 2 is a circuit diagram of the above-described composite LC resonator 101. The composite LC resonator 101 includes a first capacitor Cp, a second capacitor Cs, a first inductor L1, and a second inductor L2. A first end of the first capacitor Cp and a first end of the first inductor L1 are connected to an input/output terminal P1. The second capacitor Cs is connected in series between a second end of the first inductor L1 and a first end of the second inductor L2. A second end of the first capacitor Cp and a second end of the second inductor L2 are connected to a ground terminal GND.

The composite LC resonator 101 includes a series LC resonance circuit SR defined by the second capacitor Cs and the first and second inductors L1 and L2. The series LC resonance circuit SR and the first capacitor Cp define a parallel LC resonance circuit PR.

In the composite LC resonator 101 of this preferred embodiment, capacitors of the resonance circuit are disposed in a path between the input/output terminal P1 and the ground terminal GND, thus preventing a direct current from flowing through this path. Accordingly, a DC-cut capacitor is not necessary, and it is possible to provide a composite LC resonator which prevents a direct current from flowing therethrough by using a simple circuit, thus reducing the loss and decreasing the size of the composite LC resonator. Moreover, an attenuation pole is generated near the resonant frequency of the series LC resonance circuit SR defined by the second capacitor Cs and the first and second inductors L1 and L2.

Figure 3A:
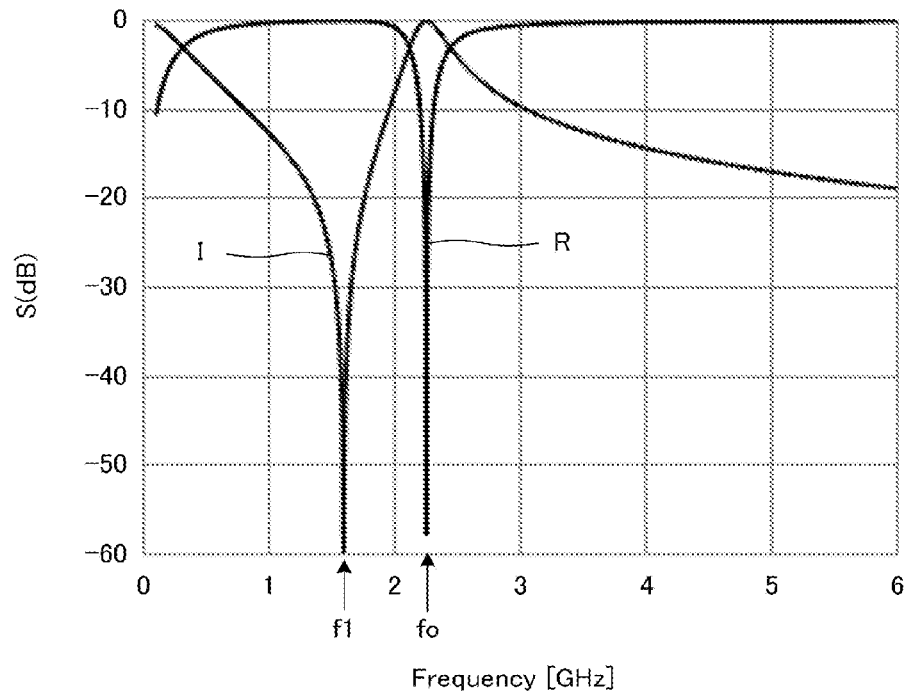
FIG. 3A is a graph illustrating frequency characteristics of the composite LC resonator 101.
Figure 3B:
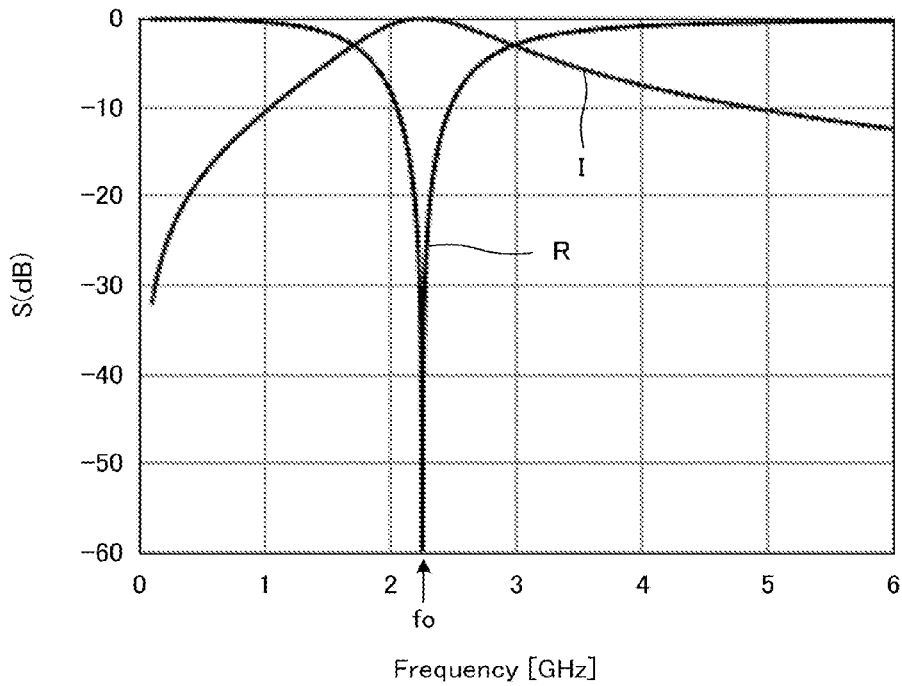
FIG. 3B is a graph illustrating frequency characteristics of an LC resonator, which is a comparative example.

FIG. 3A is a graph illustrating frequency characteristics of the composite LC resonator 101, and FIG. 3B is a graph illustrating frequency characteristics of an LC resonator, which is a comparative example. In the LC resonator of the comparative example, in FIG. 2, a single inductor is provided without disposing the second capacitor Cs, and this inductor and the capacitor Cp define a parallel LC resonance circuit. FIGS. 3A and 3B are diagrams illustrating frequency characteristics represented by S parameters S11 and S21 in a two-port network in which a resonator is shunt-connected between two ports, and a curve I indicates the characteristics of insertion loss (S21), while a curve R indicates the characteristics of return loss (S11).

As is clearly seen by comparing FIG. 3A with FIG. 3B, in the composite LC resonator of this preferred embodiment, an attenuation pole is generated at an attenuation-pole frequency f1, as shown in FIG. 3A. The generation of this attenuation pole is due to the resonance of the series LC resonance circuit SR defined by the second capacitor Cs and the first and second inductors L1 and L2 shown in FIG. 2. Accordingly, it is possible to set the attenuation-pole frequency f1 by determining the value of the second capacitor Cs. Additionally, a sharp attenuation is obtained in an elimination band at a higher frequency side than the passband near the center frequency fo. The reason for this is that a rise in the resonant frequency of the parallel LC resonance circuit PR is compensated for by providing the second capacitor Cs shown in FIG. 2 and by increasing the capacitance of the first capacitor Cp. Compared with a configuration in which the second capacitor Cs is not provided, the attenuation characteristics at a higher frequency range are improved by providing the second capacitor Cs and by increasing the capacitance of the first capacitor Cp by, for example, nearly twice.

Second Preferred Embodiment

Figure 4:
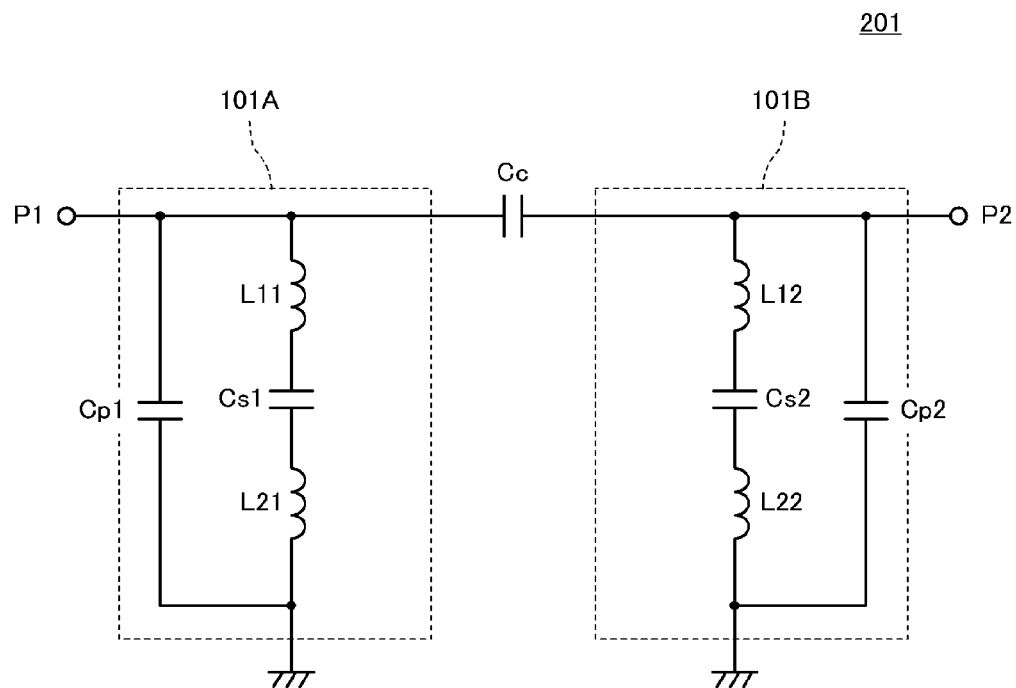
FIG. 4 is a circuit diagram of a band pass filter 201 according to a second preferred embodiment of the present invention.

In a second preferred embodiment of the present invention, a band pass filter will be discussed. FIG. 4 is a circuit diagram of a band pass filter 201. The band pass filter 201 shown in FIG. 4 includes two composite LC resonators 101A and 101B and a coupling capacitor Cc. The two composite LC resonators 101A and 101B are coupled with each other via the coupling capacitor Cc, which is a resonator coupling element. The resonant frequencies of the composite LC resonators 101A and 101B are equal to each other when they define and function as parallel resonance circuits.

The configuration of the composite LC resonators 101A and 101B is preferably the same as that of the circuit shown in FIG. 2 of the first preferred embodiment.

Figure 5:
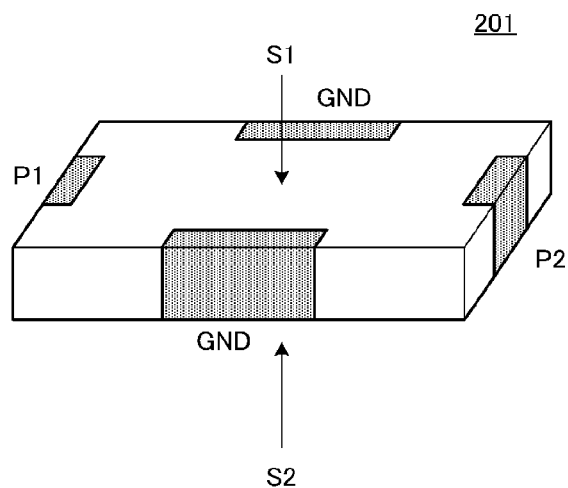
FIG. 5 is an external perspective view of the band pass filter 201.

FIG. 5 is an external perspective view of the band pass filter 201. The band pass filter 201 is provided in a multilayer body. Input/output terminals P1 and P2 and ground terminals GND extend from a first principal surface S1 to a second principal surface S2 via side surfaces of the multilayer body. The outer dimensions of this band pass filter 201 are, for example, approximately 1.6×0.8×0.6 mm.

Figure 6:
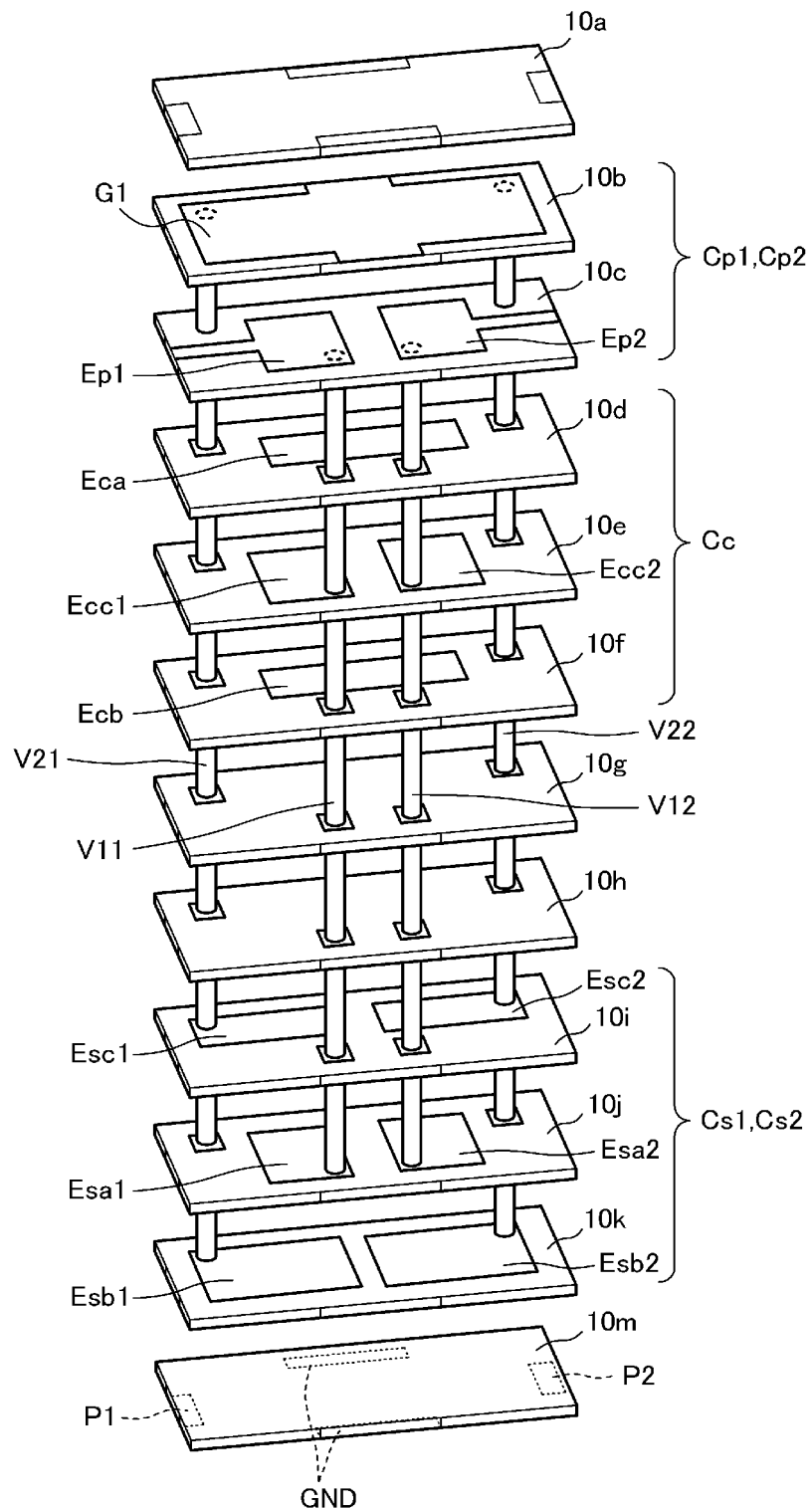
FIG. 6 is an exploded perspective view of the band pass filter 201.

FIG. 6 is an exploded perspective view of the band pass filter 201. The multilayer body is defined by insulating layers 10a through 10m stacked on each other. Plate electrodes are arranged along the principal surfaces of certain insulating layers among the multiple insulating layers. Via-electrodes pass through certain insulating layers in their direction among the multiple insulating layers. As the insulating layers, green sheets made of low-temperature sintering glass ceramics, for example, may be used. The glass sheets may be stacked and pressed against each other and be fired so as to define a multilayer body. Alternatively, a multilayer resin substrate may be used.

On the bottom surface of the insulating layer 10m, the input/output terminals P1 and P2 and ground terminals GND are provided. The ground electrode G1 is provided on the insulating layer 10b. The ground electrode G1 is connected to the ground terminals GND via side-surface ground electrodes on the two side surfaces of the multilayer body (see FIG. 5). First capacitor electrodes Ep1 and Ep2 are provided on the insulating layer 10c. The first capacitor electrodes Ep1 and Ep2 are respectively connected to the input/output terminals P1 and P2 via input/output terminal electrodes on the side surfaces of the multilayer body (see FIG. 5). The first capacitor electrodes Ep1 and Ep2 respectively define first capacitors Cp1 and Cp2, together with the ground electrode G1.

First electrodes Esa1 and Esa2 of the second capacitor are provided on the insulating layer 10j. Second electrodes Esc1 and Esc2 of the second capacitor are provided on the insulating layer 10i. Second electrodes Esb1 and Esb2 of the second capacitor are provided on the insulating layer 10k. The first electrode Esa1 of the second capacitor and the second electrodes Esb1 and Esc1 of the second capacitor define a second capacitor Cs1. The first electrode Esa2 of the second capacitor and the second electrodes Esb2 and Esc2 of the second capacitor define a second capacitor Cs2.

A coupling capacitor electrode Eca is provided on the insulating layer 10d. Coupling capacitor electrodes Ecc1 and Ecc2 are provided on the insulating layer 10e. A coupling capacitor electrode Ecb is provided on the insulating layer 10f. These coupling capacitor electrodes define the coupling capacitor Cc.

Via-electrodes V11 and V12 are provided in the insulating layers 10c through 10i. Via-electrodes V21 and V22 are provided in the insulating layers 10b through 10j. First ends of the via-electrodes V11 and V12 are electrically connected to the first capacitor electrodes Ep1 and Ep2, respectively, and second ends of the via-electrodes V11 and V12 are electrically connected to the first electrodes Esa1 and Esa2, respectively, of the second capacitor. First ends of the via-electrodes V21 and V22 are electrically connected to the ground electrode G1, and second ends of the via-electrodes V21 and V22 are electrically connected to the second electrodes Esb1 and Esb2, respectively, of the second capacitor. The via-electrodes V11 and V12 define first inductors L11 and L12, respectively, and the via-electrodes V21 and V22 define second inductors L21 and L22, respectively.

The surface of a rectangular or substantially rectangular loop surface (loop surface) partially including the above-described via-electrodes V11 and V21 is not parallel with that partially including the via-electrodes V12 and V22, and also, the via-electrodes V21 and V22 are disposed separately from each other. Accordingly, magnetic coupling between the composite LC resonators 101A and 101B is weak. Thus, as shown in FIG. 4, the composite LC resonators 101A and 101B are capacitively coupled with each other mainly via the coupling capacitor Cc. When viewing through the inside of the multilayer body from the short sides thereof, it appears that the via-electrode defining the first inductor, the via-electrode defining the second inductor, and plate electrodes linking these via-electrodes define a rectangular or substantially rectangular loop. That is, the via-electrodes V11 and V21, the first capacitor electrode Ep1, the ground electrode G1, the first electrode Esa1 of the second capacitor, and the second electrodes Esb1 and Esc1 of the second capacitor define a rectangular or substantially rectangular loop. Similarly, the via-electrodes V12 and V22, the first capacitor electrode Ep2, the ground electrode G1, the first electrode Esa2 of the second capacitor, and the second electrodes Esb2 and Esc2 of the second capacitor define a rectangular or substantially rectangular loop. These rectangular loops are "rectangular or substantially rectangular loops" described in this specification, and the surfaces defined by the rectangular or substantially rectangular loops are "loop surfaces".

The ground electrode G1 is adjacent to the first principal surface of the multilayer body, and the second electrodes Esb1 and Esb2 of the second capacitor are adjacent to the second principal surface. Resonance circuits defined by the four inductors (L11, L21, L12, and L22) and the four capacitors (Cp1, Cs1, Cp2, and Cs2) are disposed between the ground electrode G1 and the second electrodes Esb1 and Esb2 of the second capacitor. Thus, these resonance circuits are shielded by the ground electrode G1 and the second electrodes Esb1 and Esb2 of the second capacitor. It is therefore possible to significantly reduce or prevent a fluctuation in the filter characteristics caused by, for example, noise, from the outside of the filter.

Figure 7:
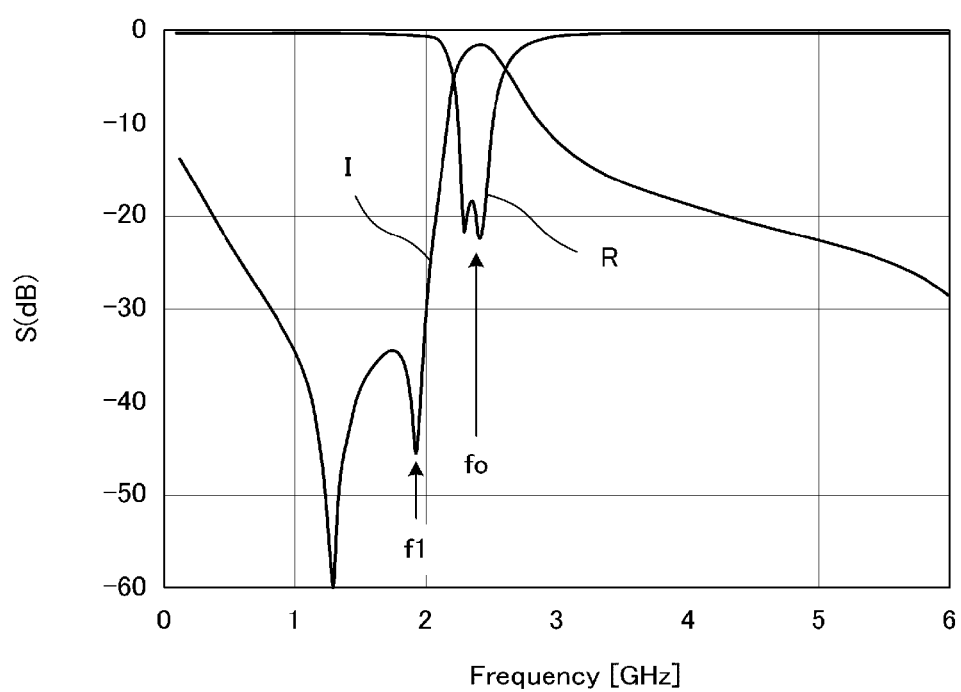
FIG. 7 is a graph illustrating frequency characteristics of the band pass filter 201.

FIG. 7 is a graph illustrating frequency characteristics of the above-described band pass filter 201. This graph illustrates the frequency characteristics, represented by the S parameters S11 and S21, of the band pass filter 201 between the two input/output terminals P1 and P2.

In FIG. 7, a curve I indicates insertion loss (S21), while a curve R indicates return loss (S11), and a passband having the center at the center frequency fo is shown. This center frequency fo is the parallel resonant frequency of the composite LC resonators 101A and 101B shown in FIG. 4. An attenuation pole is generated at the attenuation-pole frequency f1. The generation of this attenuation pole is due to the resonance of the series LC resonance circuit defined by the second capacitor Cs1 and the first and second inductors L11 and L21 shown in FIG. 4 and the resonance of the series LC resonance circuit defined by the second capacitor Cs2 and the first and second inductors L12 and L22 shown in FIG. 4.

Figure 8A:
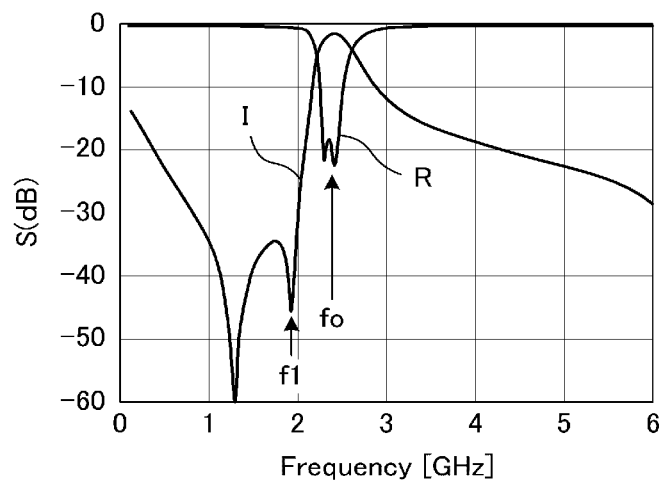
FIGS. 8A, 8B, and 8C are graphs illustrating filter characteristics when the capacitance ratio of first capacitors Cp1 and Cp2 to second capacitors Cs1 and Cs2 in the circuit shown in FIG. 4 is changed.
Figure 8B:
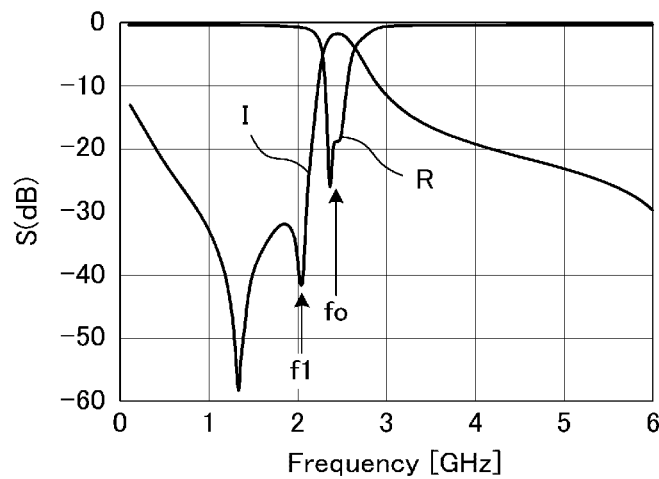
Figure 8C:
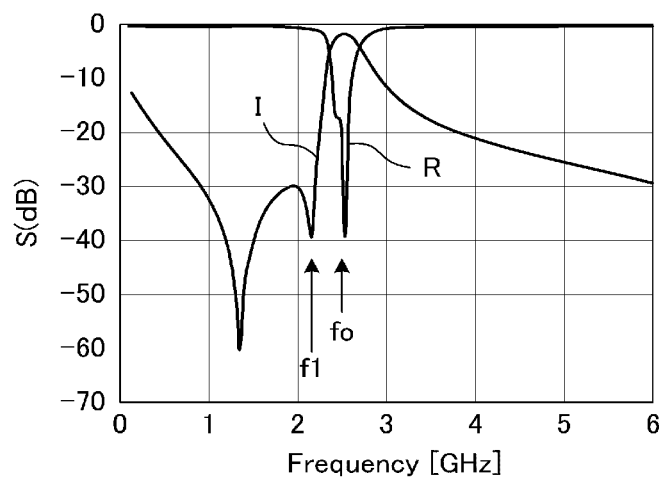

FIGS. 8A, 8B, and 8C are graphs illustrating filter characteristics when the capacitance ratio of the first capacitors Cp1 and Cp2 to the second capacitors Cs1 and Cs2 in the circuit shown in FIG. 4 is changed. It is assumed that this capacitance ratio is indicated by Cp/Cs. In this case, the graph of FIG. 8A illustrates the measured filter characteristics when Cp/Cs=1.00, the graph of FIG. 8B illustrates the measured filter characteristics when Cp/Cs=1.08, and the graph of FIG. 8C illustrates the measured filter characteristics when Cp/Cs=1.43. Comparison of the filter characteristics shown in FIGS. 8A, 8B, and 8C was made by fixing the total area of the first capacitors Cp1 and Cp2 and that of the second capacitors Cs1 and Cs2. FIGS. 8A, 8B, and 8C show that, as the capacitance ratio of the first capacitors to the second capacitors increases, the center frequency fo of the passband and the attenuation-pole frequency f1 increase. FIGS. 8A, 8B, and 8C also show that, as the capacitance ratio of the first capacitors to the second capacitors increases, the frequency difference between the center frequency fo of the passband and the attenuation-pole frequency f1 decreases.

If the difference between the center frequency fo and the attenuation-pole frequency f1 is indicated by Δf, Δf=499 MHz when Cp/Cs=1.00, Δf=444 MHz when Cp/Cs=1.08, and Δf=403 MHz when Cp/Cs=1.43. The insertion loss at the center frequency is 1.55 dB when Cp/Cs=1.00, 1.73 dB when Cp/Cs=1.08, and 1.78 dB when Cp/Cs=1.43.

In this manner, by using the capacitance ratio of the first capacitors to the second capacitors, the attenuation characteristics in the elimination band at a lower frequency side than the passband are able to be determined.

Third Preferred Embodiment

Figure 9:
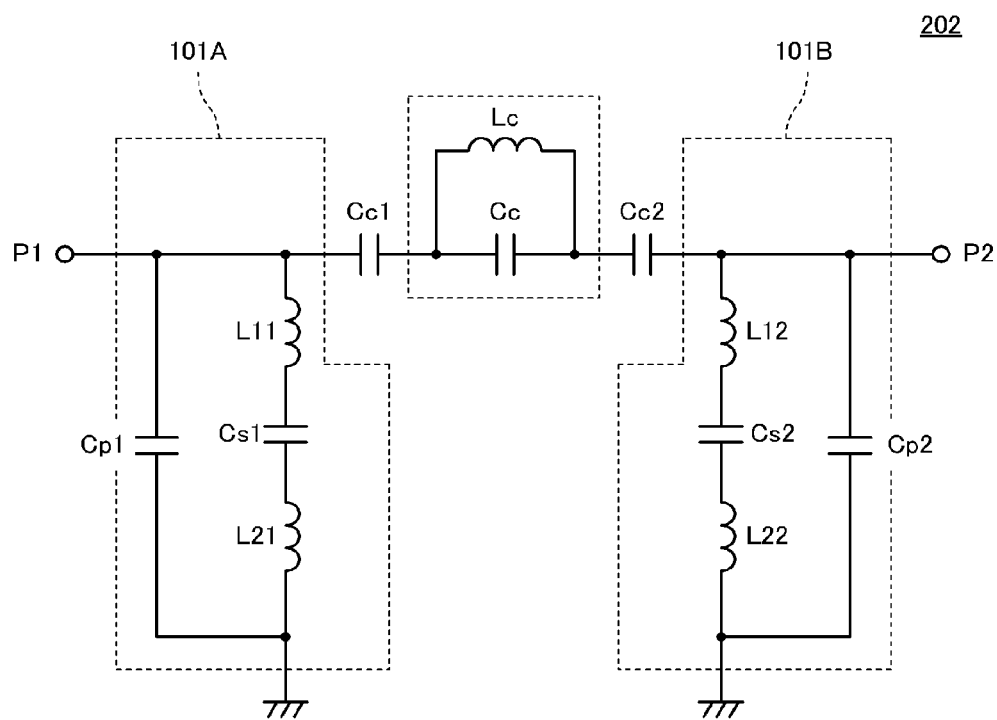
FIG. 9 is a circuit diagram of a band pass filter 202 according to a third preferred embodiment of the present invention.

FIG. 9 is a circuit diagram of a band pass filter according to a third preferred embodiment of the present invention. A band pass filter 202 shown in FIG. 9 includes two composite LC resonators 101A and 101B and a coupling circuit which couples these two resonators. The configuration of the composite LC resonators 101A and 101B is preferably the same as that of the circuit shown in FIG. 2.

The above-described coupling circuit includes a parallel LC resonance circuit defined by a coupling inductor Lc and a coupling capacitor Cc connected in parallel with each other and capacitors Cc1 and Cc2 connected in series with each other.

The capacitors Cc1 and Cc2 are capacitors defined by stray capacitances, which will be discussed later. By the capacitors Cc1 and Cc2, the input/output terminals P1 and P2 are isolated from each other in terms of a DC.

Figure 10:
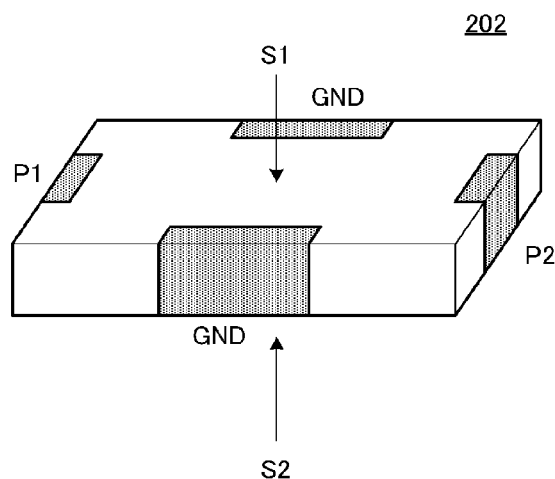
FIG. 10 is an external perspective view of the band pass filter 202.

FIG. 10 is an external perspective view of the band pass filter 202. The band pass filter 202 is provided in a multilayer body. Input/output terminals P1 and P2 and ground terminals GND extend from a first principal surface S1 to a second principal surface S2 via side surfaces of the multilayer body. The outer dimensions of this band pass filter 202 are, for example, approximately 1.6×0.8×0.6 mm.

Figure 11:
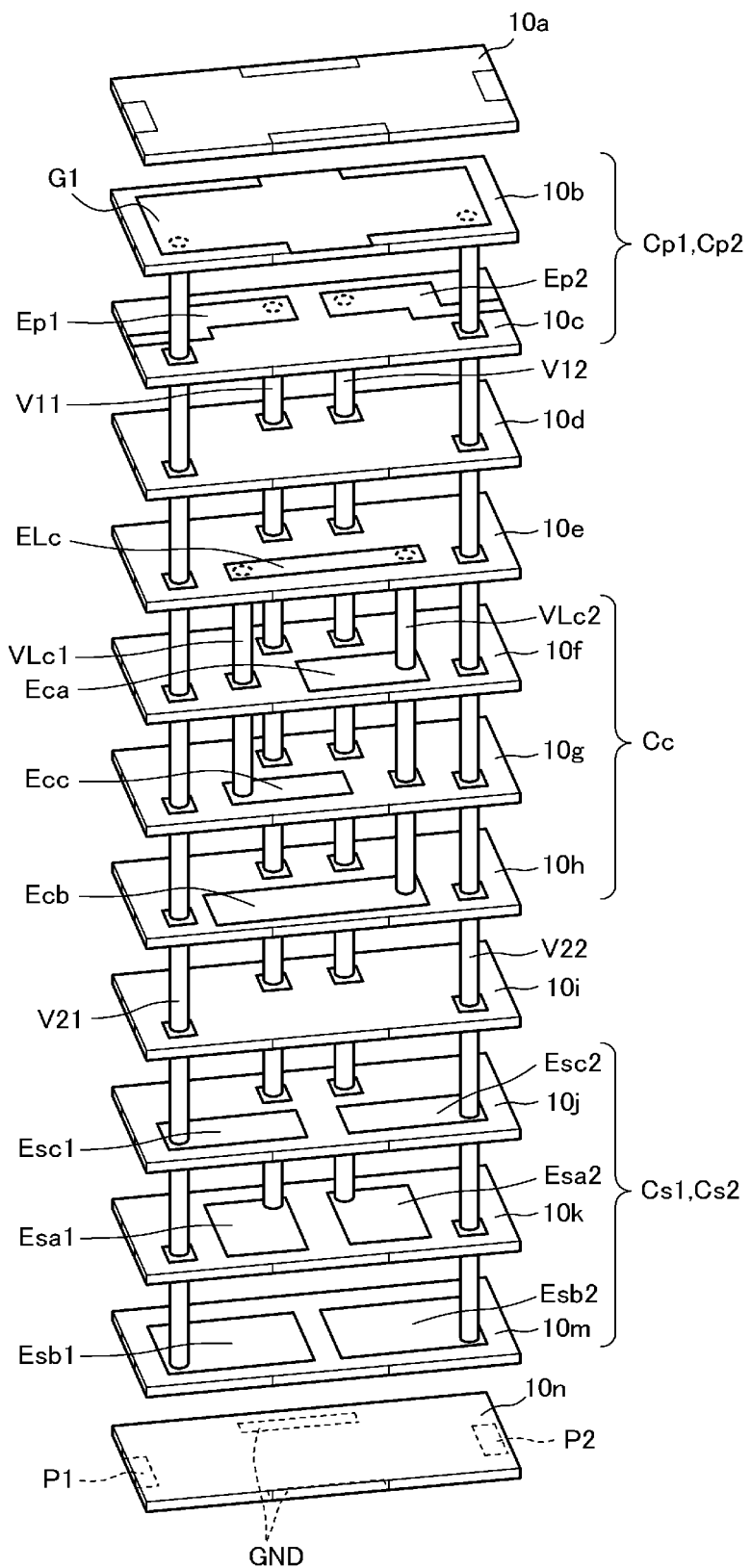
FIG. 11 is an exploded perspective view of the band pass filter 202.

FIG. 11 is an exploded perspective view of the band pass filter 202. The multilayer body is defined by insulating layers 10a through 10n stacked on each other. Plate electrodes are provided along the principal surfaces of certain insulating layers among the multiple insulating layers. Via-electrodes pass through certain insulating layers in their direction among the multiple insulating layers.

On the bottom surface of the insulating layer 10n, the input/output terminals P1 and P2 and ground terminals GND are provided. The ground electrode G1 is provided on the insulating layer 10b. The ground electrode G1 is connected to the ground terminals GND via side-surface ground electrodes formed on the two side surfaces of the multilayer body (see FIG. 10). First capacitor electrodes Ep1 and Ep2 are provided on the insulating layer 10c. The first capacitor electrodes Ep1 and Ep2 are respectively connected to the input/output terminals P1 and P2 via input/output terminal electrodes provided on the side surfaces of the multilayer body (see FIG. 10). The first capacitor electrodes Ep1 and Ep2 respectively define first capacitors Cp1 and Cp2, together with the ground electrode G1.

First electrodes Esa1 and Esa2 of the second capacitor are provided on the insulating layer 10k. Second electrodes Esc1 and Esc2 of the second capacitor are provided on the insulating layer 10j. Second electrodes Esb1 and Esb2 of the second capacitor are provided on the insulating layer 10m. The first electrode Esa1 of the second capacitor and the second electrodes Esb1 and Esc1 of the second capacitor define a second capacitor Cs1. The first electrode Esa2 of the second capacitor and the second electrodes Esb2 and Esc2 of the second capacitor form a second capacitor Cs2.

Coupling capacitor electrodes Eca, Ecc, and Ecb are provided on the insulating layers 10f, 10g, and 10h, respectively. These coupling capacitor electrodes define the coupling capacitor Cc.

A linear electrode ELc is provided on the insulating layer 10e. A via-electrode VLc2 is provided in the insulating layers 10e through 10g, while a via-electrode VLc1 is provided in the insulating layers 10e and 10f. The linear electrode ELc and the via-electrodes VLc1 and VLc2 define the coupling inductor Lc.

Via-electrodes V11 and V12 are provided in the insulating layers 10c through 10j. Via-electrodes V21 and V22 are provided in the insulating layers 10b through 10k. First ends of the via-electrodes V11 and V12 are electrically connected to the first capacitor electrodes Ep1 and Ep2, respectively, and second ends of the via-electrodes V11 and V12 are electrically connected to the first electrodes Esa1 and Esa2, respectively, of the second capacitor. First ends of the via-electrodes V21 and V22 are electrically connected to the ground electrode G1, and second ends of the via-electrodes V21 and V22 are electrically connected to the second electrodes Esb1 and Esb2, respectively, of the second capacitor. The above-described via-electrodes V11 and V12 define first inductors L11 and L12, respectively, and the via-electrodes V21 and V22 define second inductors L21 and L22, respectively.

As shown in FIG. 11, when viewing through the inside of the multilayer body from the long side surfaces thereof, the via-electrode VLc1 defining the coupling inductor is disposed between the via-electrode V11 defining the first inductor and the via-electrode V21 defining the second inductor. When viewing through the inside of the multilayer body from the long side surfaces thereof, the via-electrode VLc2 defining the coupling inductor is disposed between the via-electrode V12 defining the first inductor and the via-electrode V22 defining the second inductor. The strength of the magnetic fields of the coupling inductor mainly originates from the magnetic fields generated by the linear electrode ELc. The direction of the magnetic fields generated by the linear electrode ELc is perpendicular to that of the magnetic fields generated by the via-electrodes V11 and V12 and the via-electrodes V21 and V22. Accordingly, the coupling inductor Lc is disposed such that it is magnetically coupled with the first inductor and the second inductor only weakly.

The parallel LC resonance circuit defined by the coupling capacitor Cc and the coupling inductor Lc is connected to neither of the composite LC resonators 101A and 101B in terms of a direct current. Accordingly, as shown in FIG. 9, the equivalent circuit of the band pass filter can be represented by a circuit in which a coupling parallel LC circuit is connected between the composite LC resonators 101A and 101B via the capacitors Cc1 and Cc2 generated between the coupling capacitor electrode Ecb and the second capacitor electrodes.

The capacitor Cc1 shown in FIG. 9 is a stray capacitance generated between the electrodes (linear electrode ELc, via-electrodes VLc1 and VLc2, and capacitor electrodes Eca, Ecc, and Ecb) defining the parallel LC resonance circuit of the coupling circuit and adjacent electrodes (for example, via-electrodes V11 and V21, first capacitor electrode Ep1, and first electrode Esa1 of the second capacitor). Similarly, the capacitor Cc2 is a stray capacitance generated between the electrodes defining the parallel LC resonance circuit and adjacent electrodes (for example, via-electrodes V12 and V22, first capacitor electrode Ep2, and first electrode Esa2 of the second capacitor).

By changing the positional relationship between the via-electrodes V11 and V21 and the via-electrode VLc1 and the positional relationship between the via-electrodes V12 and V22 and the via-electrode VLc2, it is possible to adjust the amount of coupling between the inductors L11 and L21 of the first-stage composite LC resonator 101A and the coupling inductor Lc and between the inductors L12 and L22 of the second-stage composite LC resonator 101B and the coupling inductor Lc. This also makes it possible to set filter characteristics in accordance with the amount of coupling between the two composite LC resonators via the coupling inductor.

The above-described coupling parallel LC resonance circuit is provided at a position which does not influence the area where the composite LC resonators 101A and 101B are located. It is thus possible to adjust the amount of coupling without increasing the size of the multilayer body.

Figure 12:
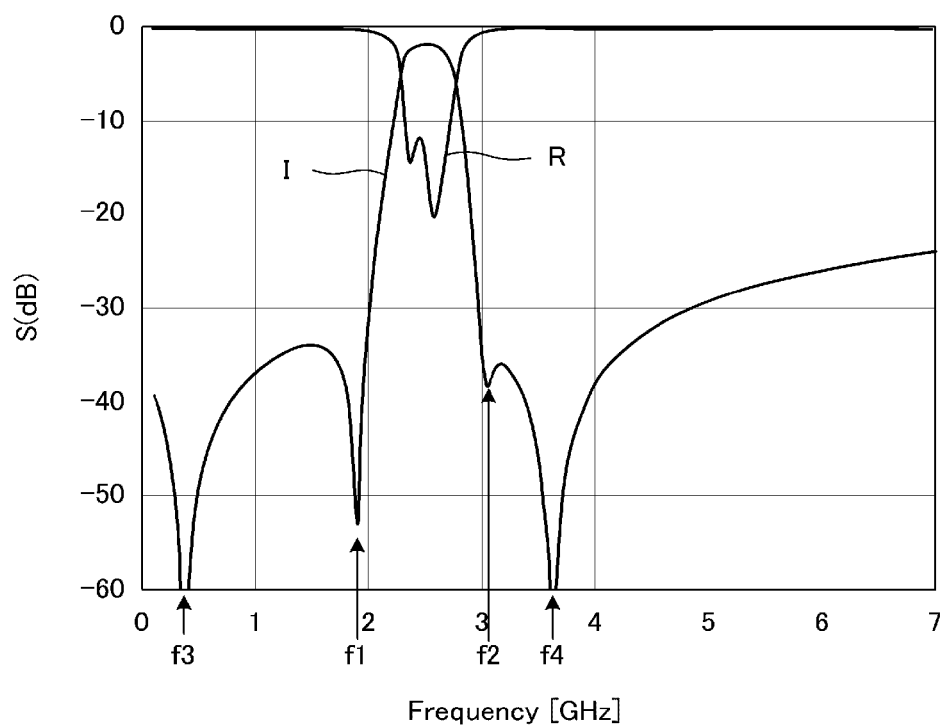
FIG. 12 is a graph illustrating frequency characteristics of the band pass filter 202.

FIG. 12 is a graph illustrating frequency characteristics of the above-described band pass filter 202. This graph illustrates the frequency characteristics, represented by the S parameters S11 and S21, of the band pass filter 202 between the two input/output terminals P1 and P2.

In FIG. 12, a curve I indicates insertion loss (S21), while a curve R indicates return loss (S11), and attenuation poles are generated at attenuation-pole frequencies f1 and f2. The generation of the attenuation pole at the attenuation-pole frequency f1 is due to the resonance of the series LC resonance circuit defined by the second capacitor Cs1 and the first and second inductors L11 and L21 shown in FIG. 9 and the resonance of the series LC resonance circuit defined by the second capacitor Cs2 and the first and second inductors L12 and L22 shown in FIG. 9. The generation of the attenuation pole at the attenuation-pole frequency f2 is due to the resonance of the parallel LC resonance circuit including the coupling inductor Lc and the coupling capacitor Cc connected in parallel with each other shown in FIG. 9. That is, a signal attenuates at the resonant frequency of this parallel LC resonance circuit. The generation of the attenuation poles at frequencies f3 and f4 is due to the coupling of the two composite LC resonators 101A and 101B.

In this manner, by the provision of the parallel LC resonance circuit in the coupling circuit, an attenuation pole is able to be generated, and by setting the frequency of this attenuation pole in an elimination band near the passband, it is possible to make the selectivity of the passband sharp. Moreover, as shown in FIG. 12, if the attenuation pole at the attenuation-pole frequency f1 generated by the series LC resonance circuit appears near a lower frequency side of the passband, the attenuation pole at the attenuation-pole frequency f2 generated by the parallel LC circuit of the coupling circuit is set so that it may appear near a higher frequency side of the passband, thus making it possible to make the selectivity of both frequency sides of the passband sharp.

The above-described band pass filters preferably include two composite LC resonators, for example. However, a band pass filter including three or more composite LC resonators sequentially coupled with each other may be provided in a similar manner. Moreover, the via-electrodes may be formed as follows. Via-holes are provided in insulating layers, and then, a conductive paste is charged into the via-holes or electrodes are provided on the front sides of the via-holes. A conductor substance, such as a metal pin, may be used as an interlayer connecting element.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite LC resonator comprising:
   a multilayer body including a plurality of insulating layers stacked on each other, plate electrodes extending along principal surfaces of the plurality of insulating layers, and via-electrodes passing through insulating layers of the plurality of insulating layers in a direction in which the plurality of insulating layers are stacked;
   a plurality of capacitors; and
   a plurality of inductors; wherein
   the plurality of capacitors and the plurality of inductors are defined by the plate electrodes and the via-electrodes or one of the plate electrodes and the via-electrodes;
   a ground electrode disposed adjacent to a first principal surface of the principal surfaces of the multilayer body;
   a first capacitor electrode that is disposed farther inward in the direction in which the plurality of insulating layers are stacked than the ground electrode and that defines a first capacitor of the plurality of capacitors together with the ground electrode;
   a first electrode of a second capacitor of the plurality of capacitors;
   a second electrode of the second capacitor that defines the second capacitor together with the first electrode of the second capacitor;
   a first inductor of the plurality of inductors defined by one of the via-electrodes, a first end of the first inductor being electrically connected to the first capacitor electrode and a second end of the first inductor being electrically connected to the first electrode of the second capacitor; and
   a second inductor of the plurality of inductors defined by another one of the via-electrodes, a first end of the second inductor being directly connected to the second electrode of the second capacitor and a second end of the second inductor being directly connected to the ground electrode.

2. A band pass filter comprising:
   a plurality of composite LC resonators in a single multilayer body, each of the plurality of composite LC resonators being defined by the composite LC resonator according to claim 1; and
   a coupling electrode that couples adjacent ones of the plurality of composite LC resonators.

3. The band pass filter according to claim 2, wherein the coupling electrode includes a coupling capacitor electrode electrically connected to the via-electrode defining the first inductor and electrically connected to the first capacitor electrode.

4. The band pass filter according to claim 2, wherein the coupling electrode includes a coupling inductor electrode and a coupling capacitor electrode connected in parallel with each other.

5. The band pass filter according to claim 4, wherein the coupling inductor electrode is partially defined by one of the via-electrodes.

6. The band pass filter according to claim 5, wherein the via-electrode defining the coupling inductor electrode is disposed between the via-electrode defining the first inductor and the via-electrode defining the second inductor.

7. The composite LC resonator according to claim 1, wherein the
   ground electrode, the second electrode of the second capacitor, the first capacitor electrode, and the first electrode of the second capacitor are disposed perpendicularly to the via-electrodes.

8. The composite LC resonator according to claim 1, wherein the first inductor and the second inductor are connected in series with each other via the second capacitor.

9. The composite LC resonator according to claim 1, wherein a series LC resonance circuit is defined by the second capacitor and the first and second inductors.

10. The composite LC resonator according to claim 9, wherein the series LC resonance circuit and the first capacitor define a parallel LC resonance circuit.

11. The composite LC resonator according to claim 9, wherein the second capacitor included in the LC series resonance circuit is disposed in a path between an input/output terminal and the ground electrode to prevent a direct current from flowing through the path.

12. The composite LC resonator according to claim 9, wherein an attenuation pole is generated near a resonant frequency of the series LC resonance circuit.

13. The composite LC resonator according to claim 1, wherein a pair of the via-electrodes, the first capacitor electrode, the ground electrode, the first electrode of the second capacitor, and the second electrode of the second capacitor define a rectangular or substantially rectangular loop.

14. The composite LC resonator according to claim 1, wherein a plurality of resonance circuits are defined by the plurality of inductors and the plurality of capacitors disposed between the ground electrode and the second electrode of the second capacitor.

15. A band pass filter comprising:
    a plurality of composite LC resonators in a single multilayer body, each of the plurality of composite LC resonators being defined by the composite LC resonator according to claim 1; and
    a coupling circuit that couples adjacent ones of the plurality of composite LC resonators.

16. The band pass filter according to claim 15, wherein the coupling circuit includes a parallel LC resonance circuit defined by a coupling inductor and a coupling capacitor connected in parallel with each other and third and fourth capacitors connected in series with each other.

* * * * *